US009444041B2

(12) United States Patent
Lim et al.

(10) Patent No.: US 9,444,041 B2
(45) Date of Patent: Sep. 13, 2016

(54) BACK-GATED NON-VOLATILE MEMORY CELL

(71) Applicant: GLOBALFOUNDRIES Singapore Pte. Ltd., Singapore (SG)

(72) Inventors: Khee Yong Lim, Singapore (SG); Kian Ming Tan, Singapore (SG); Elgin Kiok Boone Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/144,554

(22) Filed: Dec. 31, 2013

(65) Prior Publication Data

US 2014/0264554 A1 Sep. 18, 2014

Related U.S. Application Data

(60) Provisional application No. 61/786,609, filed on Mar. 15, 2013.

(51) Int. Cl.
| | |
|---|---|
| *H01L 45/00* | (2006.01) |
| *H01L 29/423* | (2006.01) |
| *H01L 27/24* | (2006.01) |
| *H01L 29/66* | (2006.01) |
| *H01L 29/792* | (2006.01) |
| *G11C 16/04* | (2006.01) |

(52) U.S. Cl.
CPC ....... *H01L 45/1226* (2013.01); *G11C 16/0466* (2013.01); *H01L 27/2436* (2013.01); *H01L 29/4234* (2013.01); *H01L 29/42324* (2013.01); *H01L 29/42328* (2013.01); *H01L 29/42344* (2013.01); *H01L 29/66833* (2013.01); *H01L 29/792* (2013.01); *H01L 45/126* (2013.01); *H01L 45/1608* (2013.01); *H01L 45/1691* (2013.01)

(58) Field of Classification Search
None
See application file for complete search history.

(56) References Cited

U.S. PATENT DOCUMENTS

| | | | |
|---|---|---|---|
| 6,043,535 A | 3/2000 | Houston | |
| 7,732,864 B2 | 6/2010 | Kawahara et al. | |
| 2002/0020840 A1* | 2/2002 | Nakajima | 257/57 |
| 2002/0089876 A1* | 7/2002 | Park | G11C 16/0416 365/185.18 |
| 2002/0105039 A1* | 8/2002 | Hanafi et al. | 257/401 |
| 2003/0235064 A1* | 12/2003 | Batra et al. | 365/100 |
| 2004/0029322 A1* | 2/2004 | Prall | 438/142 |
| 2006/0125017 A1* | 6/2006 | Liu | 257/365 |
| 2009/0108314 A1 | 4/2009 | Cai et al. | |
| 2011/0227159 A1 | 9/2011 | Chan et al. | |
| 2013/0175595 A1* | 7/2013 | Cheng et al. | 257/304 |

FOREIGN PATENT DOCUMENTS

| | | |
|---|---|---|
| CN | 1979879 A | 6/2007 |
| CN | 101515586 A | 8/2009 |
| JP | 2010153634 A | 7/2010 |
| TW | 201242025 A1 | 10/2012 |
| WO | 2012174771 | 12/2012 |

* cited by examiner

*Primary Examiner* — Fei Fei Yeung Lopez
(74) *Attorney, Agent, or Firm* — Horizon IP Pte. Ltd.

(57) ABSTRACT

A memory device and a method of making the same are presented. The memory device includes a substrate and a memory cell formed on the substrate. The memory cell includes a single transistor. The single transistor includes a first gate on the substrate which functions as a control gate and a second gate embedded in the substrate which functions as a select gate.

19 Claims, 16 Drawing Sheets

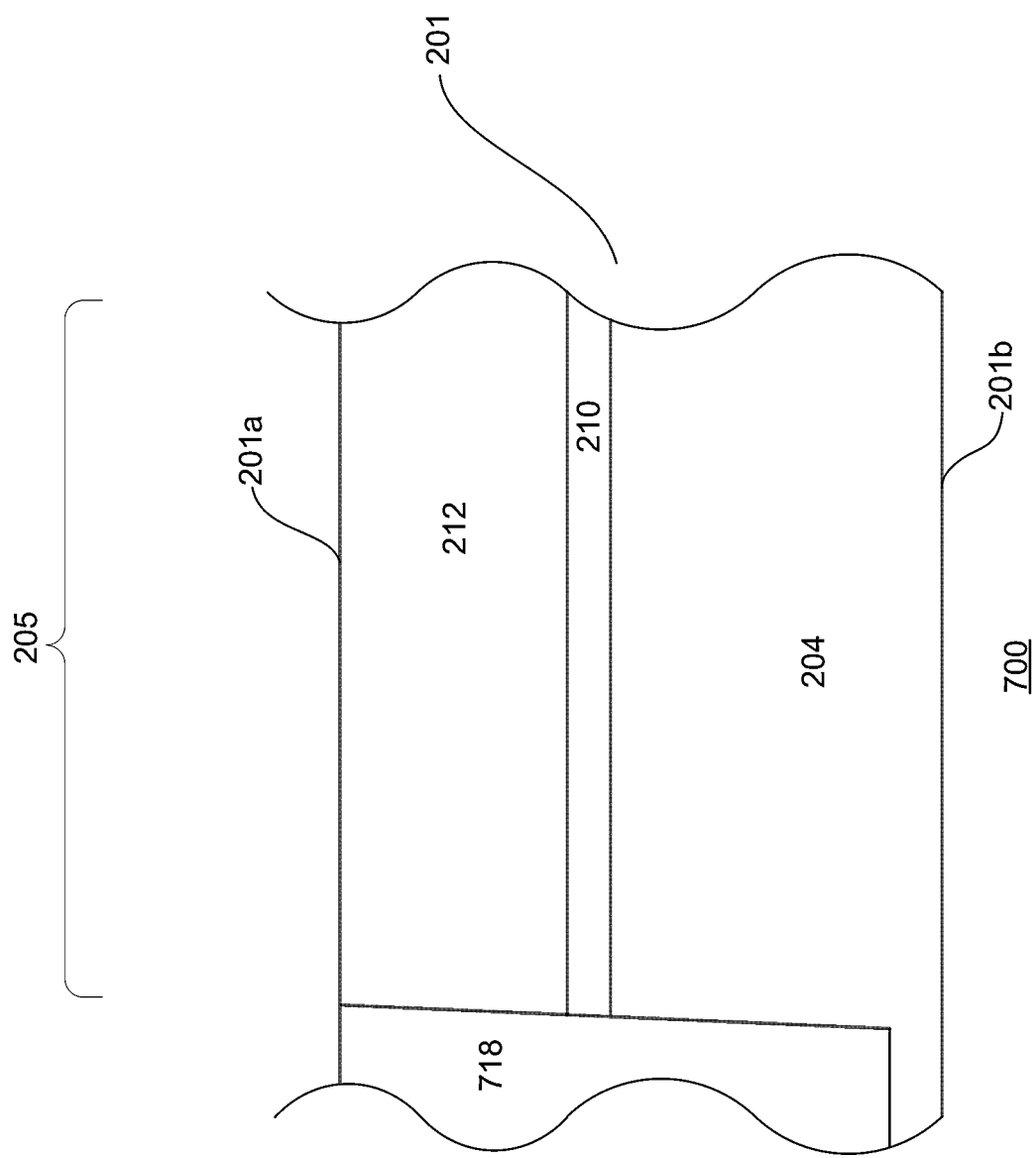

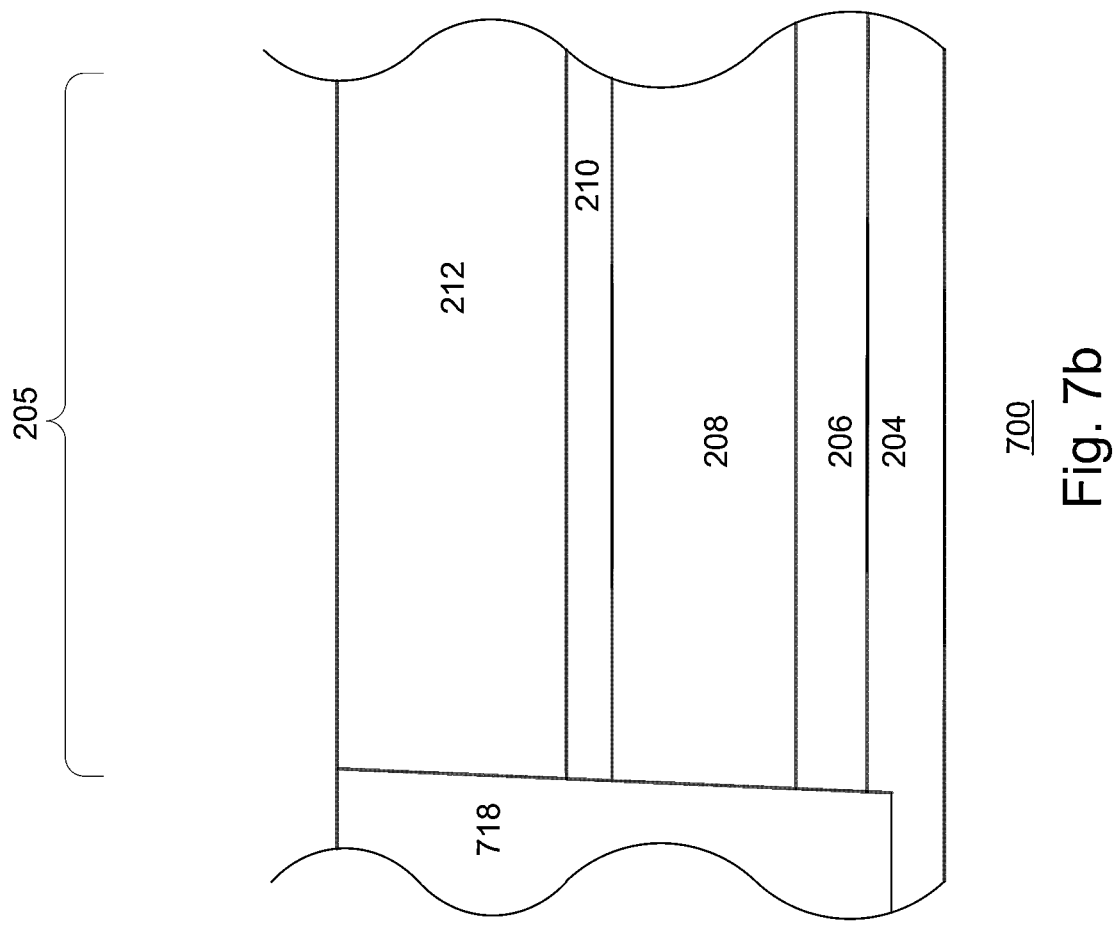

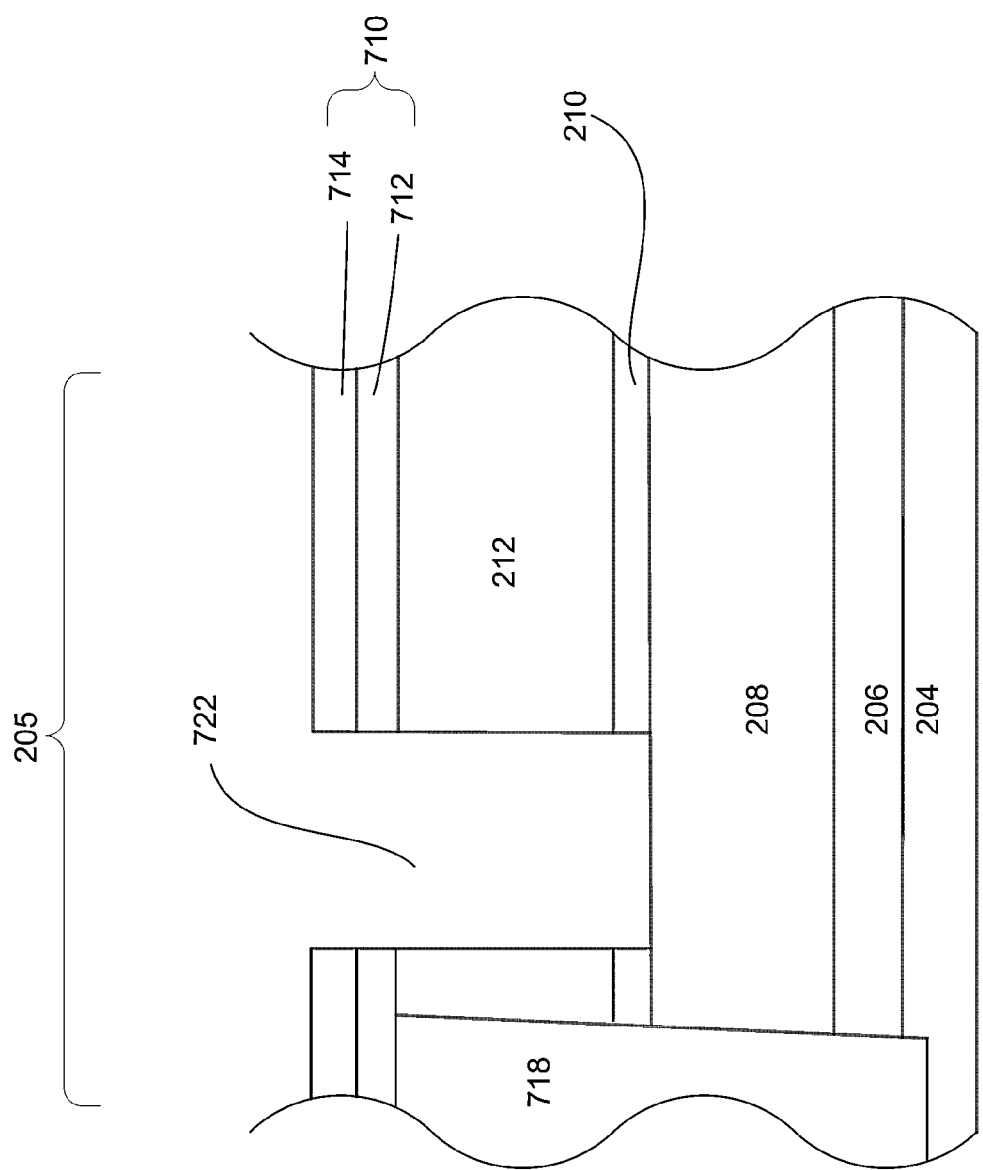

| Terminal | Source | | Drain | | CG | | BG | |
|---|---|---|---|---|---|---|---|---|
| Cell | Sel | Unsel | Sel | Unsel | Sel | Unsel | Sel | Unsel |
| Program | 0 | 0 | Vdrain | 0 | Vprog | 0 | 0 | Vinhib1 |
| Erase | 0 | 0 | 0 | 0 | Verase | 0 | 0 | 0 |
| Read | 0 | 0 | Vdd | 0 | Vdd | 0 | 0 | -Vdd |

Fig. 9

BACK-GATED NON-VOLATILE MEMORY CELL

CROSS-REFERENCE TO RELATED APPLICATION

This application claims the priority benefit of U.S. Provisional Application Ser. No. 61/786,609, filed on Mar. 15, 2013, which is herein incorporated by reference in its entirety.

BACKGROUND

A random access memory (RAM) device includes a memory array with numerous memory cells interconnected to store information. Non-volatile memory ("NVM") cell, such as Silicon-Oxide-Nitride-Oxide-Silicon ("SONOS") type of NVM cell, is distinguished from mainstream flash by the use of silicon nitride instead of polysilicon for the charge storage material.

SONOS cells are generally formed from a standard polysilicon N-channel MOSFET transistor with the presence of a small sliver of silicon nitride inserted inside the transistor's gate oxide. The sliver of nitride is non-conductive but contains a large number of charge trapping sites able to hold electrostatic charge. The nitride layer is electrically isolated from the surrounding transistor, although charges stored on the nitride directly affect the conductivity of the underlying transistor channel.

When the polysilicon control gate is biased positively, electrons from the transistor source and drain regions will tunnel through the oxide layer and get trapped in the silicon nitride. This results in an energy barrier between the drain and the source, thereby raising the threshold voltage. The electrons can be removed and the cell erased by applying a negative bias on the control gate. A select gate may be used to eliminate over-erase cell disturb issues, however, this will result in larger feature size as 2 transistors are needed for every single memory cell built. This will result in the need for a larger chip area in order to accommodate the components, which would in turn results in higher costs. Additionally, it is also desirable to achieve other benefits e.g., high mobility and low random dopant fluctuation ("RDF"), etc.

From the foregoing discussion, it is desirable to provide improved and compact NVM memory cells. It is also desirable to provide a simplified method for forming such NVM memory cells.

SUMMARY

Embodiments generally relate to NVM devices. In one embodiment, the device includes a substrate and a memory cell on the substrate. The memory cell includes a single transistor. The single transistor includes a first gate on the substrate which functions as a control gate and a second gate embedded in the substrate which functions as a select gate.

In another embodiment, a method for forming a memory device includes providing a substrate. A memory module is formed on the substrate. The method includes forming a first gate on the substrate that functions as a control gate, and forming a second gate in the substrate that functions as a select gate.

In yet another embodiment, a method for forming a device is disclosed. The method includes providing a substrate and forming a memory module on the substrate. A first gate is formed on the substrate that functions as a control gate and a second gate is formed in the substrate that functions as a select gate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 7a-7g show an embodiment of a process for forming a device;

FIG. 9 shows a table of the biased conditions on the various terminals of the thin-SOI NVM cell.

DETAILED DESCRIPTION

Embodiments generally relate to NVM devices. For example, embodiments generally relate to thin silicon-on-insulator (SOI) back gated NVM device or cell. The NVM device or cell can be of various types including, for example, floating gate type, metal-nitride-oxide-silicon (MNOS) type, silicon-nitride-oxide-silicon (SNOS) type, metal-oxide-nitride-oxide-silicon (MONOS) type, silicon-oxide-nitride-oxide-silicon (SONOS) type or TaN Aluminum Oxide Nitride Oxide Silicon ("TANOS") type. Other suitable types of NVM or memory devices may also be useful. Such NVM devices may be incorporated into electronic products or equipment, such as phones, computers, mobile smart products, etc.

Figure 1:
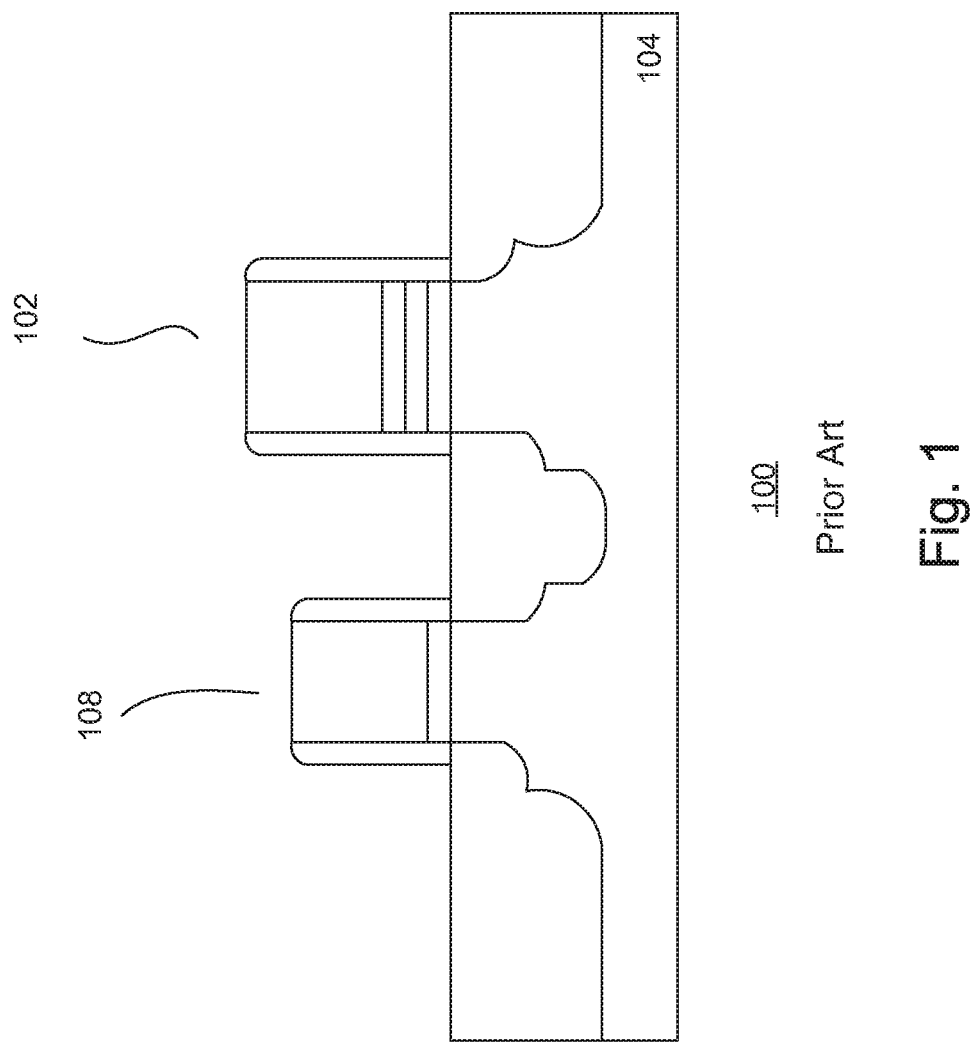
FIG. 1 shows a conventional two transistors (2T) NVM cell.

FIG. 1 shows a conventional 2T NVM cell 100. Cell 100, as shown, has a first or memory transistor which functions as control memory cell 102 for storing the memory information, and a second or select transistor 108 for eliminating over-erase cell disturb issue formed on a substrate 104. Given that cell 100 has two transistors for every single memory cell built; this will result in larger feature size and thereby requiring the need for a larger chip area to accommodate the components.

Figure 2:
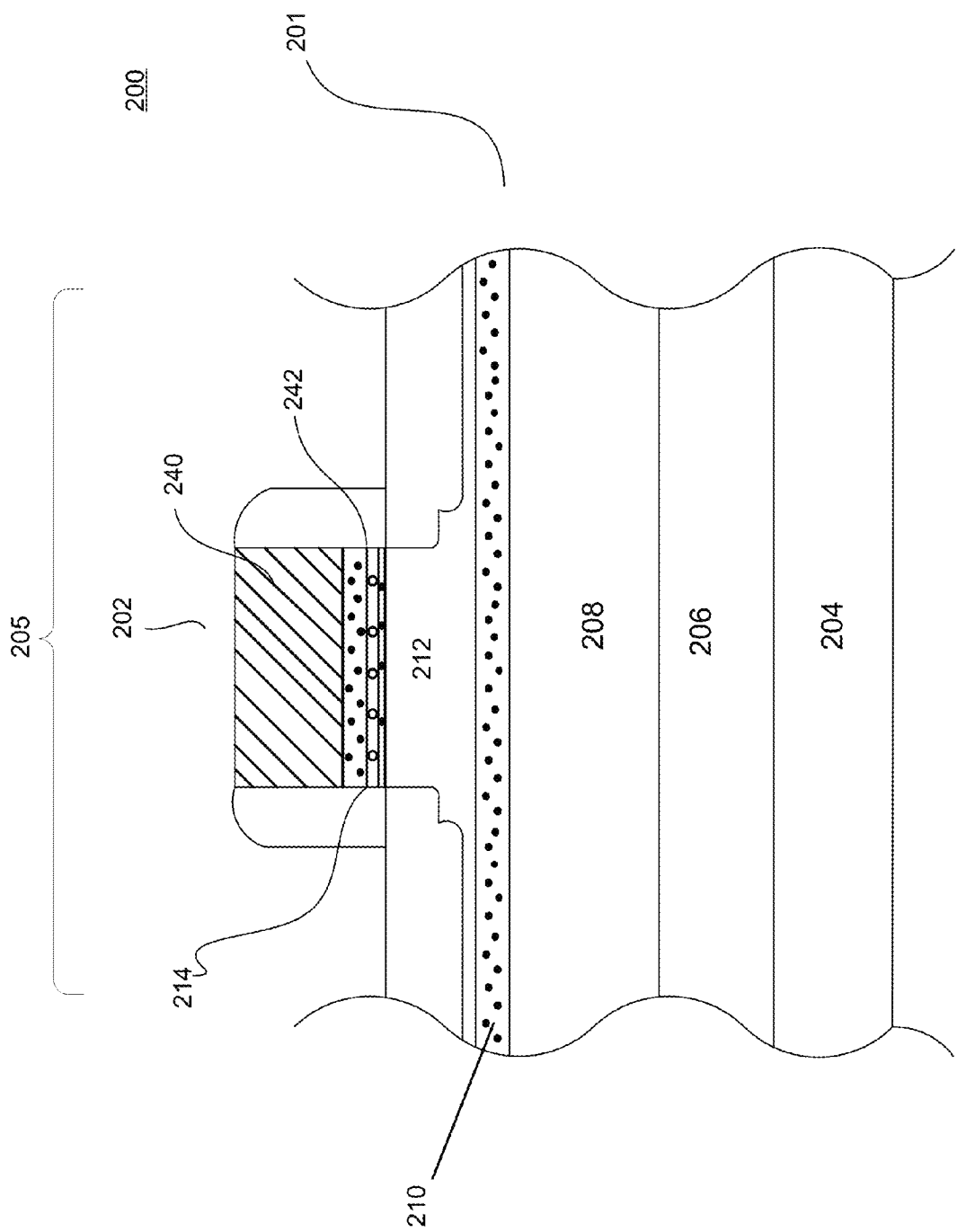
FIG. 2 shows an embodiment of a single transistor (1T) thin-SOI memory cell.

FIG. 2 shows an embodiment of a single transistor (1T) NVM cell 200. For illustration purpose, the 1T NVM cell, for example, is shown as a SONOS cell. It is understood that the 1T NVM cell 200 can include various suitable types, including but not limited to floating gate type, MNOS type, etc., as described above. As shown, cell 200 includes a first or front-gate 202 with feature size that fits within presently known scaling constraints of flash memory. The first gate 202, for example, may act like a control gate. The gate 202, in one embodiment, is built on very thin-silicon-on-insulator (SOI) with back-gate threshold voltage ("Vt") control to mitigate over-erase cell disturb issue, thereby eliminating the need for a conventional select gate structure as will be described in detail later. Other performance benefits, for example, super steep sub-threshold slope and short channel control, high mobility and low RDF may all be realized from the thin-SOI architecture of NVM cell 200.

The first or front-gate 202 is disposed over a substrate 201. The substrate 201, for example, is a crystalline-on-insulator (COI) substrate. For example, the COI substrate is a silicon-on-insulator (SOI) substrate. Other suitable types of COI substrates, such as germanium-on-insulator (GeOI) substrate, may also be useful. In one embodiment, the COI substrate includes an insulator layer, such as a buried oxide (BOX) layer 210 sandwiched by a top substrate or body substrate 212 and a bottom or base substrate 204. In the case of a SOI substrate, the body substrate 212 includes silicon, forming a silicon body. The substrate may be a P-type substrate, but in other embodiment, other suitable types of substrates may also be used. FIG. 2 shows a portion of the substrate which is prepared with a memory region 205 containing the memory cell 200 of the device. It is understood that the substrate may be prepared with other types of regions (not shown). For example, the substrate may include a logic region for support of other types of logic circuitry. The substrate may also include regions for other types of circuitry, depending on the type of device or IC. For example, the logic region may include sub-regions for intermediate voltage (IV) devices, low voltage (LV) devices, etc.

In one embodiment, cell 200 includes a second or back-gate 208 embedded in the substrate 201. In one embodiment, the second or back-gate 208 is disposed over and within the base substrate 204. A first polarity band or well 206 for a second polarity doped back gate control layer 208 may also be disposed over and within the base substrate 204 for isolating the back-gate control 208. For example, the first polarity may be n-type while the second polarity may be p-type, forming a N+ band for a P+ doped back-gate control layer. Alternatively, the first polarity may be p-type while the second polarity may be n-type, forming a P+ band for a N+ doped back-gate control layer. A bias may be applied to the back-gate control layer 208 through a contact (not shown) to store data in cell 200. The second gate 202, for example, may act like a select gate.

As described, the substrate 201 includes a base substrate 204, an oxide layer 210 and body or top substrate 212. The substrate 201, in one embodiment, employs a very thin body substrate 212 to achieve better control of the channel by the gate and hence reducing leakage and short channel effects. For example, the thin body substrate 212 is a silicon body. The thickness of the silicon body and the oxide layer, for example, is about less than 30 nm and 5 nm, respectively. This forms an ultra-thin body SOI. Other suitable thickness dimensions for the body substrate and insulator layer may also be useful as long as they are sufficiently thin to provide better control of the channel by the gate. Use of the intrinsic or lightly doped silicon body 212 also reduces threshold voltage variations due to less RDF thereby enhancing the mobility of carriers in the channel region and therefore increasing the ON current. In addition, the back-gate control layer 208 and oxide layer 210 serve as a second or back-gate to control the cell Vt, thus controlling localized NVM cell leakage independently as required.

Referring to FIG. 2, the front-gate 202 includes a front gate electrode 240 and a front gate dielectric 242. The front gate dielectric 242 may include a single dielectric layer or a dielectric stack. In one embodiment, the front gate dielectric includes a dielectric stack. The dielectric stack, in one embodiment, includes a charge trapping layer. The charge trapping layer 214, in one embodiment, includes a nano-crystal layer or a nitride layer, forming the SONOS cell. Other suitable types of charge trapping layer may also be used. Alternatively, in yet another embodiment, a floating gate or other charge trap type of memory device instead of SONOS type may be built on top of the thin SOI back-gate control 208. Furthermore, while the above discussion relates to SONOS, in another embodiment, it may also apply to TANOS. It should be understood that all the discussions below relating to SONOS may also apply to TANOS.

Figure 3:
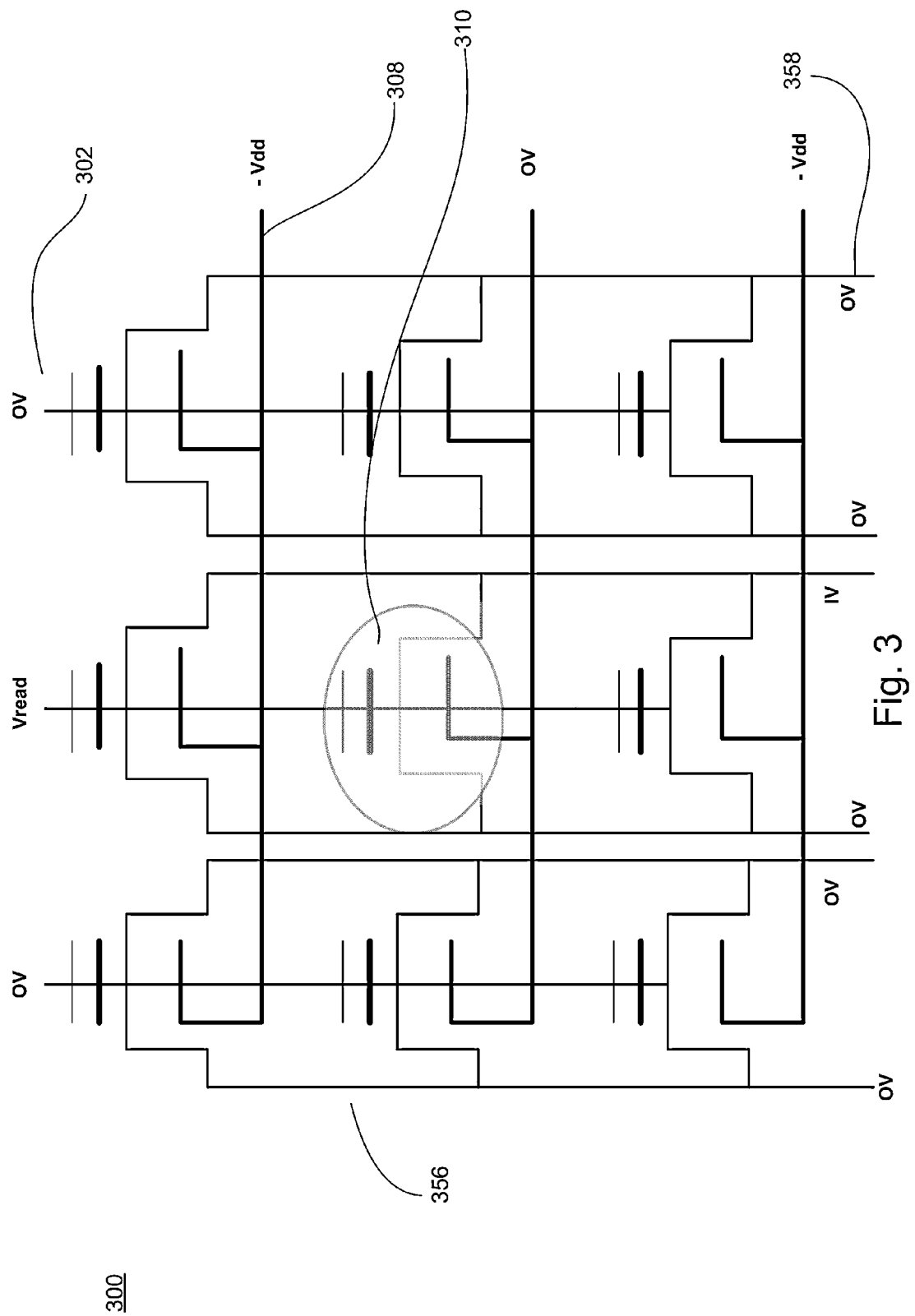
FIG. 3 shows a stacked gate schematic of thin-SOI NVM cells.

FIG. 3 shows an embodiment of a 3×3 stacked gate schematic of thin-SOI NVM cells 300. The thin-SOI NVM cell, for example, may be a thin-SOI SONOS cell. Cells 300 may be easily embedded into planar ultra-thin SOI process for, for example, 20 nm and below advanced technology node. As can be seen, each individual cell of cells 300 has a control gate 302, a back-gate 308, source line 356 and bit line 358. The control gate 302, source line 356 and bit line 358 are all connected vertically; while the back-gate 308 is connected horizontally, with each row of back-gate 308 being separated by top and bottom silicon trench isolation ("STI"). Each cell unit as denoted by circle 310 has a control gate 302 with back-gate 308 which is repeated over the whole array.

Figure 4:
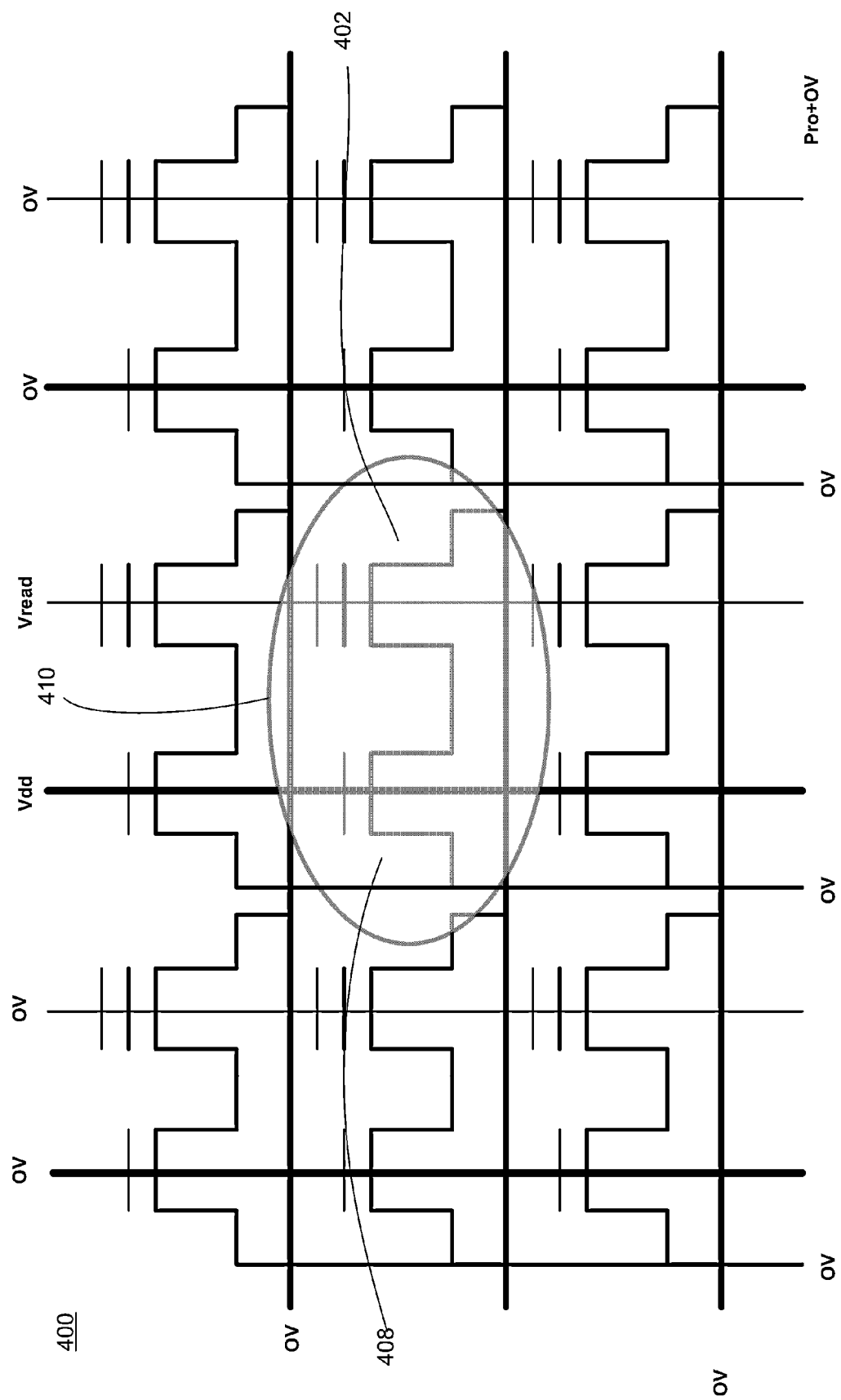
FIG. 4 shows a stacked gate schematic of conventional SONOS cells.

Referring to FIG. 4, which shows a 3×3 stacked gate schematic of conventional SONOS cells 400; it can be seen that each unit cell, which is denoted by circle 410, has a control gate 402 and a select gate 408, which is repeated over the whole array. As such, each unit cell of thin-SOI NVM cells 300, which includes only a control gate 302 with back-gate 308, is smaller in size than each unit cell of conventional cells 400. Hence, the use of thin-SOI NVM cells 300 would result in reduction of array layout as compared to conventional cells 400.

Figure 5:
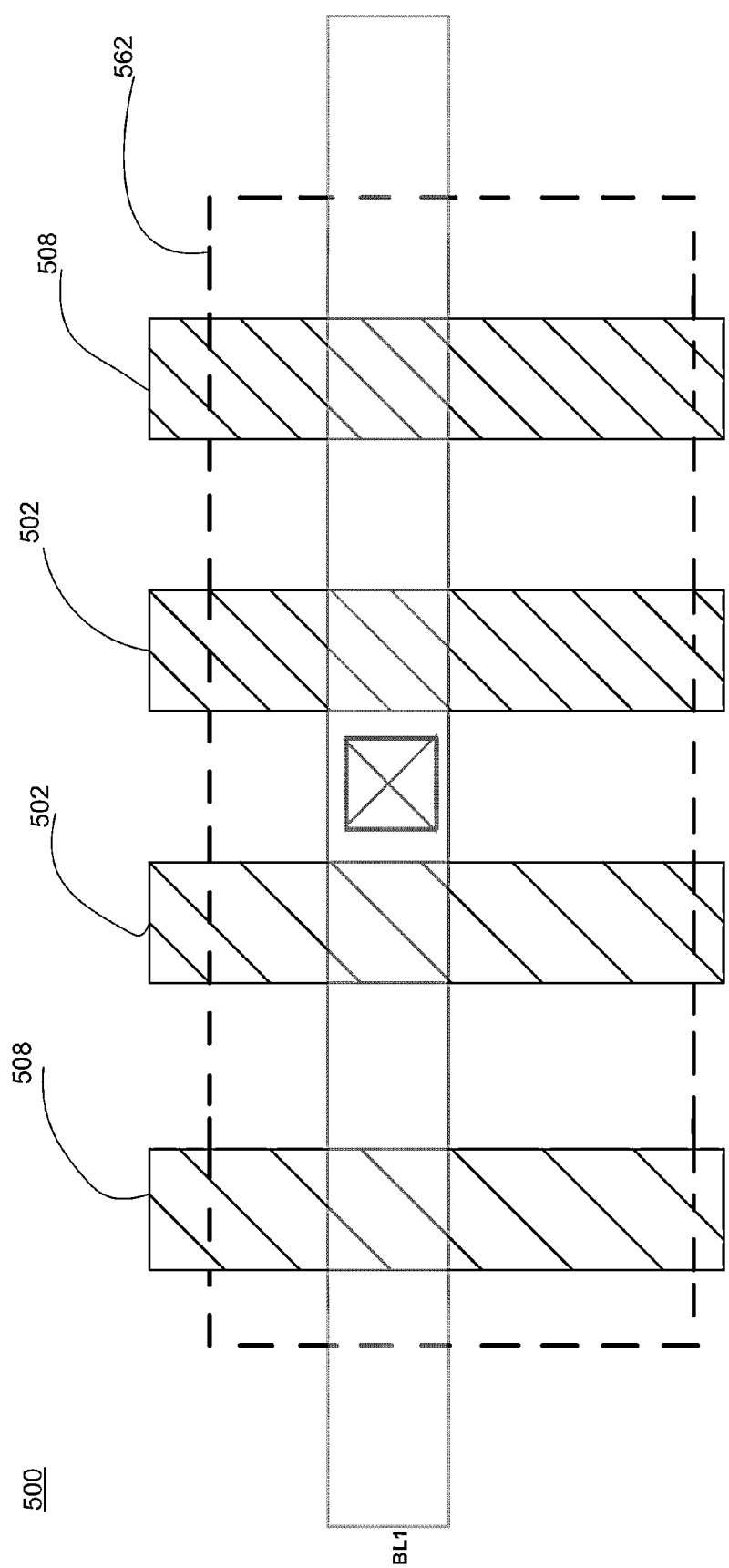
FIG. 5 shows a layout of conventional SONOS cells.
Figure 6:
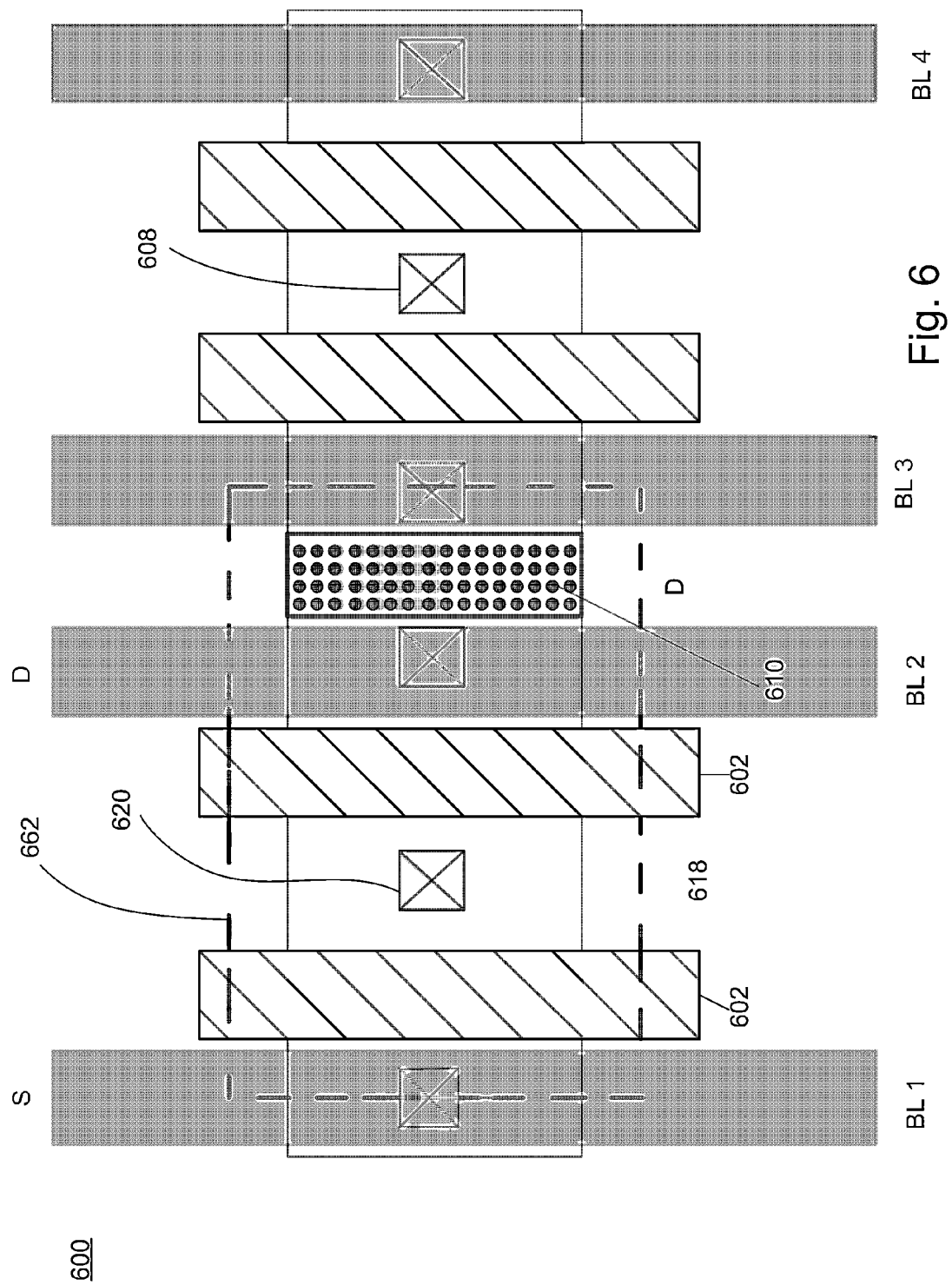
FIG. 6 shows an embodiment of a layout of thin-SOI NVM cells.

FIG. 5 shows a layout of conventional SONOS cells 500. As shown, layout 500 has a dotted box 562, within which boundary there are two memory cells; each memory cell having a select gate 508 and control gate 502. FIG. 6 shows a layout of thin-SOI NVM cells 600. Layout 600 also shows a dotted box 662, within which boundary there are also 2 memory cells. The memory cells however, include of only a control gate 602, with STI 618 separating the control gates of individual thin-SOI SONOS memory cells.

The back-gate, which is underneath the front gate 602, is not shown in FIG. 6. The buried oxide layer is underneath the front gate 602, and is also not shown in FIG. 6. A contact 620 may be formed to couple with the back-gate control layer (not shown) to store data in cell. A comparison of layout 500 and 600 by adopting 55 nm tech node design and assuming that the select gate 508 and control gate 502 lengths are 0.12 µm and 0.1 µm, respectively; shows that layout 600 has a smaller cell size of about 12.5% as compared to layout 500.

Figure 7D:
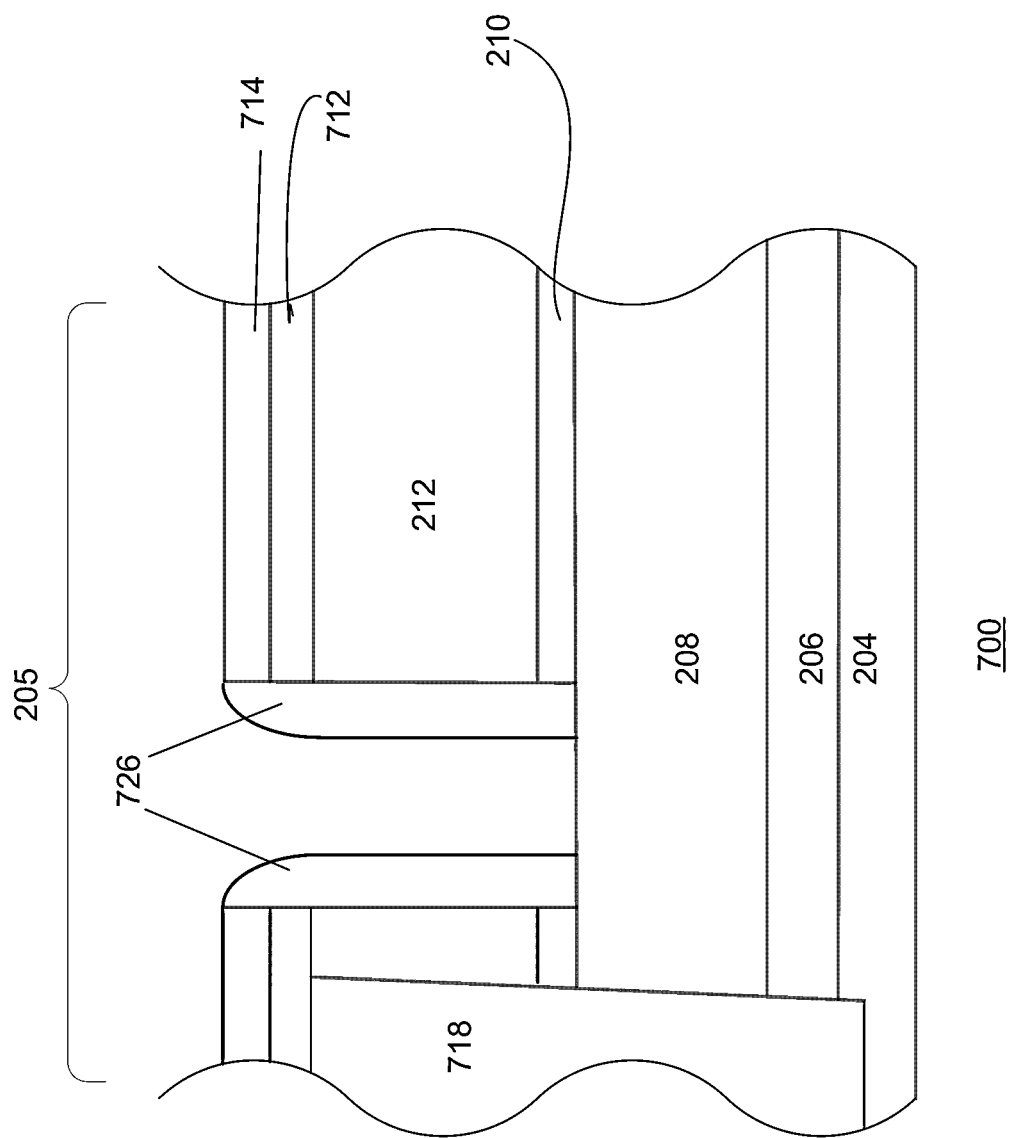

FIGS. 7a-7g show cross-sectional views of an embodiment of a process 700 for forming a device. The device, for example, is a one-transistor (1T) non-volatile memory (NVM) cell, similar to that described in FIG. 2. Common elements may not be described or described in detail. Referring to FIG. 7a, a substrate 201 is provided. The substrate, for example, is a crystalline-on-insulator (COI) substrate. For example, the COI substrate is a silicon-on-insulator (SOI) substrate. Other types of COI substrates may also be useful. The COI substrate may be provided by a wafer manufacturer or produced by a device manufacturer.

In one embodiment, the COI substrate includes an insulator layer 210, such as a buried oxide (BOX) layer, sandwiched by a base or bottom substrate 204 and a top or body substrate 212. In the case of a SOI substrate, the body substrate 212 includes silicon, forming a silicon body. The thickness of the insulator layer 210 and the body substrate 212, for example, may be about less than 5 nm and 30 nm, respectively, forming an ultra-thin body SOI substrate. Other suitable thickness dimensions may also be useful for the insulator layer and body substrate. The substrate 201 includes first and second opposing major surfaces 201a-201b. The first major surface may be referred to as the top surface and the second surface may be referred to as the bottom surface. Other designations may also be useful.

The substrate 201 may be prepared with a memory region 205 containing memory cells 200 of the device. Providing a substrate prepared with other types of regions (not shown) may also be useful. For example, the substrate may include a logic region (not shown) for support of other types of logic circuitry. The substrate may also include regions for other types of circuitry, depending on the type of device or IC. For example, the logic region may include sub-regions for intermediate voltage (IV) devices, low voltage (LV) devices, etc.

The substrate 201 includes isolation regions 718 to isolate active device regions from other active device regions, as required. The isolation regions, for example, are STI regions. Various processes can be employed to form the STI regions. For example, the substrate can be etched using etch and mask techniques to form trenches which are then filled with dielectric materials such as silicon oxide. Chemical Mechanical Polishing (CMP) can be performed to remove excess oxide and provide a planar substrate top surface. Other processes can also be used to form the STIs. Other types of isolation regions are also useful. The depth of the isolation regions 718, for example, is deeper than the bottom of the insulator layer 210.

Referring to FIG. 7b, the substrate may be implanted with dopants to define a second or back-gate control layer 208 and a first polarity band or well 206 for a second polarity doped back gate control layer 208. For example, multiple implants may be performed for forming the back-gate control layer 208 and the first polarity well 206. In one embodiment, the base substrate 204 is doped with first polarity type dopants to form the first polarity band 206 for a second polarity type back-gate control layer 208. The first polarity band or well 206 may be heavily doped. The first polarity band 206 includes a depth, for example, shallower than the bottom of the isolation region 718.

The process continues to form the second or back-gate control layer by implanting the base substrate 204 with second polarity type dopants. The back-gate control layer, in one embodiment is heavily doped. The depth of the back-gate control layer 208, for example, is shallower than a bottom of the first polarity band 206. In one embodiment, the first polarity type may be n-type while the second polarity may be p-type, forming a N+ band for a P+ doped back-gate control layer. Alternatively, the first polarity may be p-type while the second polarity may be n-type, forming a P+ band for a N+ doped back-gate control layer. The P-type dopants can include boron (B), indium (In) or a combination thereof while the n-type dopants can include phosphorus (P), arsenic (As), antimony (Sb) or a combination thereof. The first polarity type doped band or well serves to isolate the back-gate control layer 208 from the base substrate 204. The back-gate control layer 208, for example, may act like a select gate.

Referring to FIG. 7c, the process continues to form a capping layer 710 over the top surface 201a of the substrate for mesa isolation which is used to isolate adjacent semiconductor devices formed on the common substrate and for back gate contact opening processes. In one embodiment, the capping layer 710 includes a dielectric stack. In one embodiment, the dielectric stack includes an oxide/nitride stack. For example, the capping layer 710 includes a silicon oxide $SiO_2$ layer 712 and a silicon nitride SiN layer 714 over the $SiO_2$, forming a $SiO_2$/SiN stack over the top surface 201a of the substrate. The capping layer, for example, is formed over the top surface of the substrate using chemical vapor deposition (CVD) technique. Other suitable types of deposition technique may also be employed.

The process continues to form a back gate contact opening 722. To form the back gate contact opening 722, a mask (not shown) is formed on the capping layer. The mask, for example, is a soft mask, such as a resist (not shown). The resist is patterned by exposing the resist with an exposure source and reticle with the desired pattern of the contact opening. The exposed resist is developed, transferring the pattern of the reticle to the resist. The capping layer 710 is patterned to expose a portion of a top surface 201a of the substrate. For example, the capping layer is patterned, forming an opening exposing a portion of the top surface of the body substrate 212. The resist, for example, may be removed after patterning the capping layer. The resist, for example, may be removed by ashing. Other techniques for removing the resist mask may also be useful. The process continues to remove exposed portion of the body substrate and the underlying insulator layer to form an opening 722 to expose a portion of the top surface of the back-gate control layer 208 where back-gate contact 720 (shown in FIG. 7e) is to be formed. Patterning the body substrate and the insulator layer, for example, may be achieved by an etch process using the patterned capping layer as an etch mask. The etch process, for example, includes a reactive ion etch (RIE). Other suitable types of removal techniques may also be used to remove the exposed portion of the body substrate and the underlying insulator layer.

A dielectric spacer layer is formed on the substrate, lining the surface of the capping layer and opening 722. The dielectric spacer layer, for example, is a silicon oxide spacer layer. Other types of dielectric spacer layers may also be useful. The spacer layer may be formed by, for example, CVD. Other techniques for forming the spacer layer may also be useful. The spacer layer is patterned to form spacers 726 with optimized thickness on sidewalls of the opening 722 as shown in FIG. 7d. Patterning, for example, may be an anisotropic etch, such as a RIE. The etch removes horizontal portions of the spacer layer, leaving spacers 726 on sidewalls of the opening. Other suitable techniques may be used to form the spacers. The spacers 726, for example, isolate a back gate mesa contact from the body substrate 212.

Figure 7E:
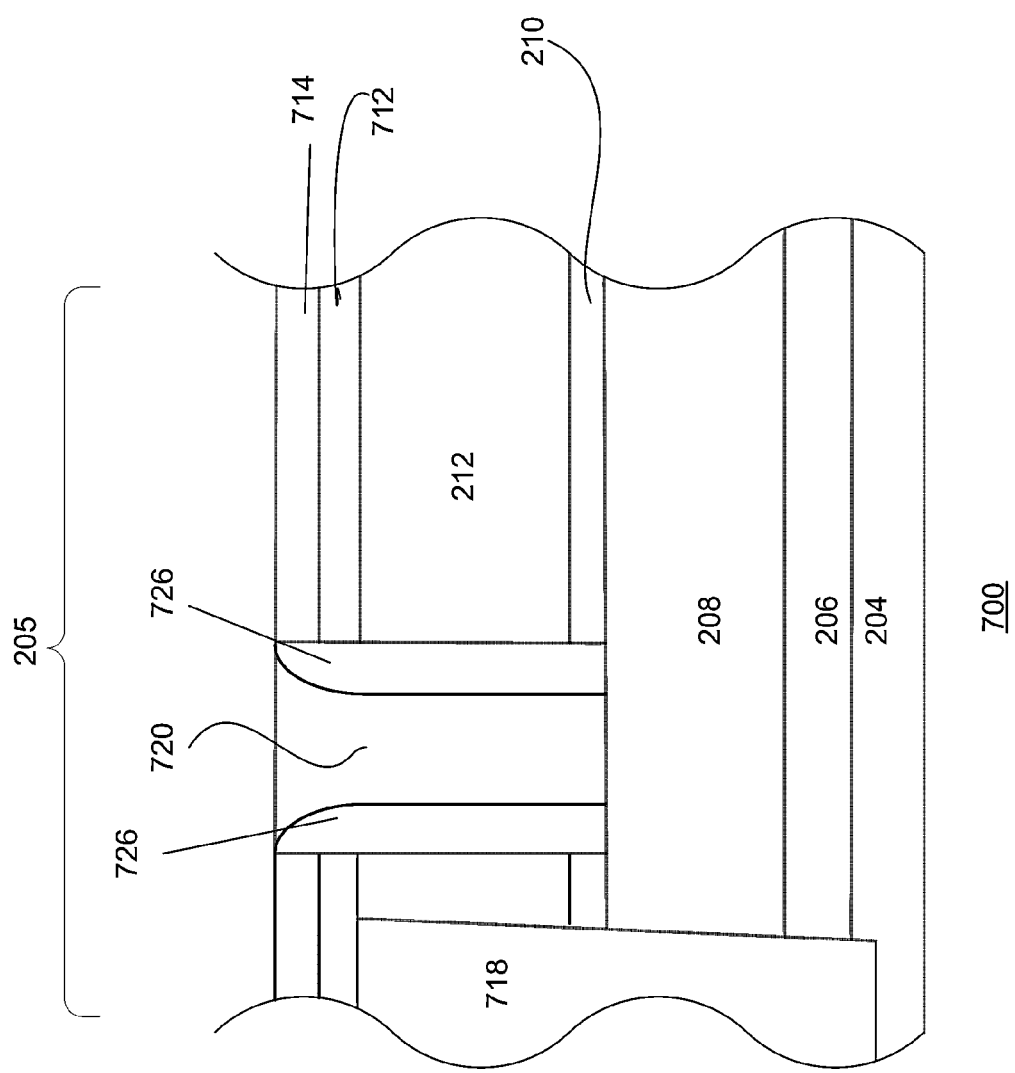

The process continues to form a back gate contact 720 as shown in FIG. 7e. In one embodiment, a contact layer, such as a polysilicon layer, is formed over the substrate and fills the remaining opening 722. For example, the contact layer is formed by CVD. Other techniques for depositing the contact layer may also be useful. A planarizing process, such as chemical mechanical polishing (CMP), is performed to remove excess contact material to form the back gate contact 720 and to provide a co-planar top surface of the back gate contact with the capping layer. Thus, the capping layer, such as the SiN layer, serves as the CMP stop layer. In an alternate embodiment, the contact layer is formed in the opening 722 via an epitaxial process. For example, polysilicon is epitaxially grown within the opening to form the back gate contact 720. If epitaxial growth process is employed, a CMP process would not be necessary. An etch back process may optionally be performed to optimize the back gate contact height. The capping layer, for example, may be removed to expose the top substrate surface 201a.

Figure 7F:
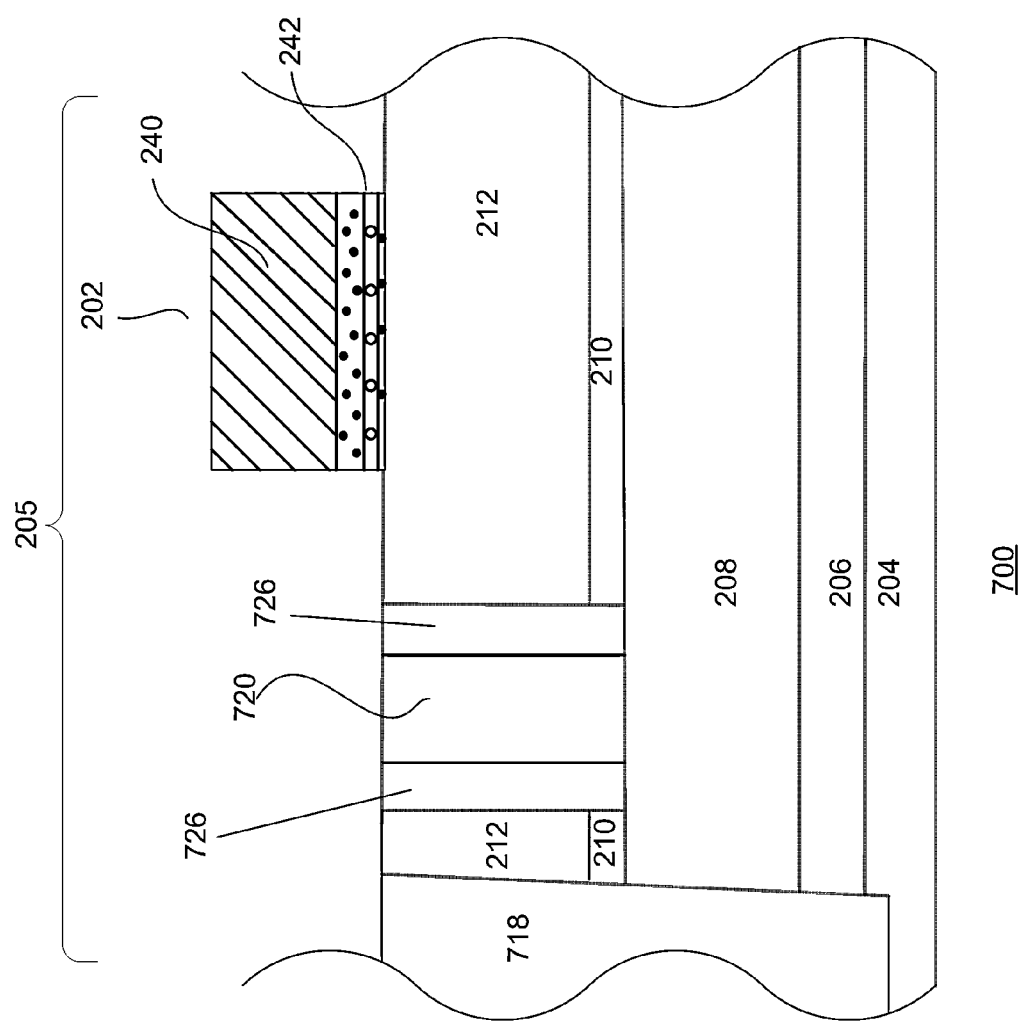

Referring to FIG. 7f, a front gate 202 is formed on the top substrate surface 201a. The front gate 202 includes a front gate electrode 240 and a front gate dielectric 242. The front gate may be formed by depositing a front gate dielectric layer over the substrate and a front gate electrode layer over the front gate dielectric layer. Depending on the type of NVM cell, the front gate dielectric layer may be a single dielectric layer or include multiple dielectric layers, forming a dielectric stack. In one embodiment, the front gate electrode layer, for example, includes polysilicon while the front gate dielectric stack, for example, includes a charge trapping layer, such as nano-crystal layer or a nitride layer. Other suitable types of gate electrode and gate dielectric layers may also be used. The front gate electrode and dielectric layers may be formed over the top surface of the substrate using CVD. Other suitable techniques may also be useful. The front gate electrode and dielectric layers may then be patterned to form the front gate 202 using suitable mask and etch techniques.

Figure 7G:
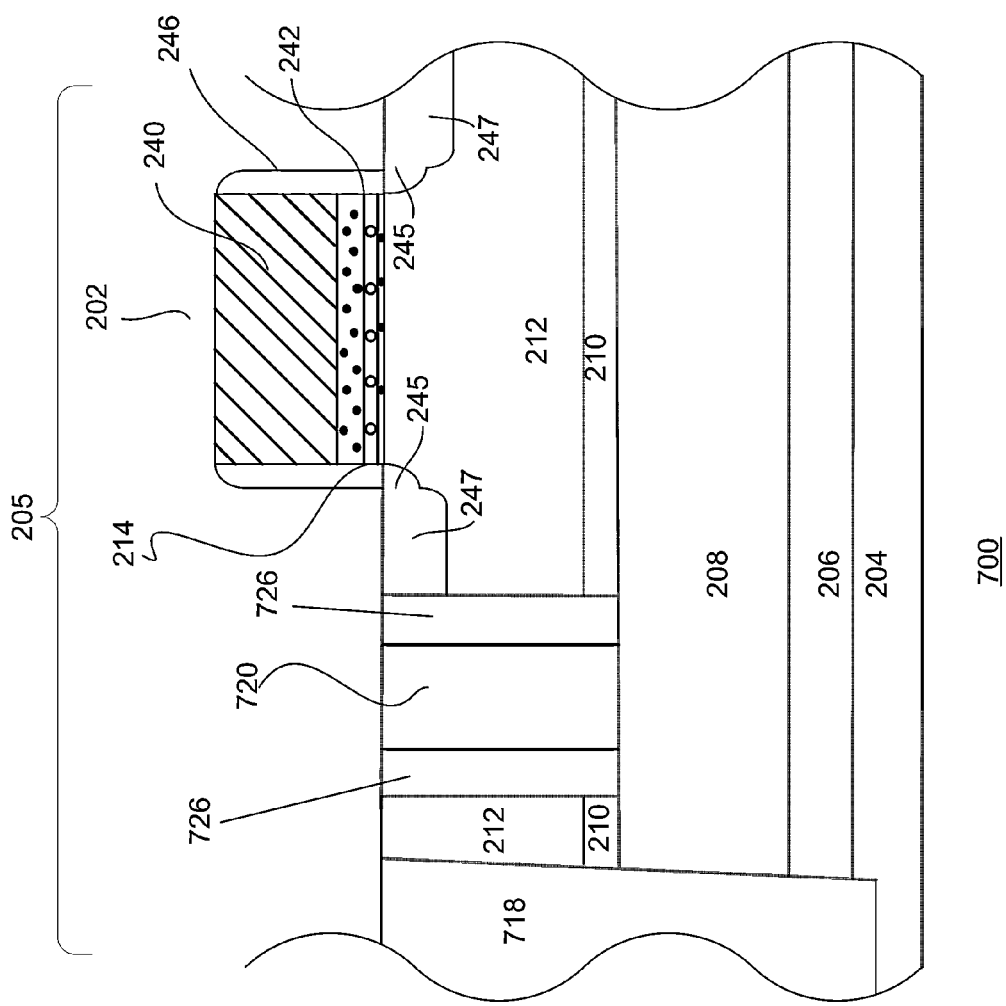

Referring to FIG. 7g, a halo and/or an extension implant process may be performed to form halo regions and/or lightly doped diffusion regions 245. Dielectric spacers 246 may be formed on the sidewalls of the gate and diffusion regions, such as source/drain regions 247, may be formed after the formation of the dielectric spacers. The source/drain (S/D) regions 247 are heavily doped S/D regions. Raised S/D regions may optionally be formed over the body substrate. Silicide contacts (not shown) may be formed over the S/D regions by performing a salicidation process. As shown, the front gate 202, which acts like a control gate, is built on very thin-silicon-on-insulator (SOI) with a back-gate control layer 208, which acts like a select gate and is embedded in the substrate, forming a 1T thin-SOI NVM cell. The process continues to complete the device. For example, the process continues to perform back-end-of-line (BEOL) process and the wafer is then diced to singulate the devices. Additional or other processes may also be performed.

Figure 8A:
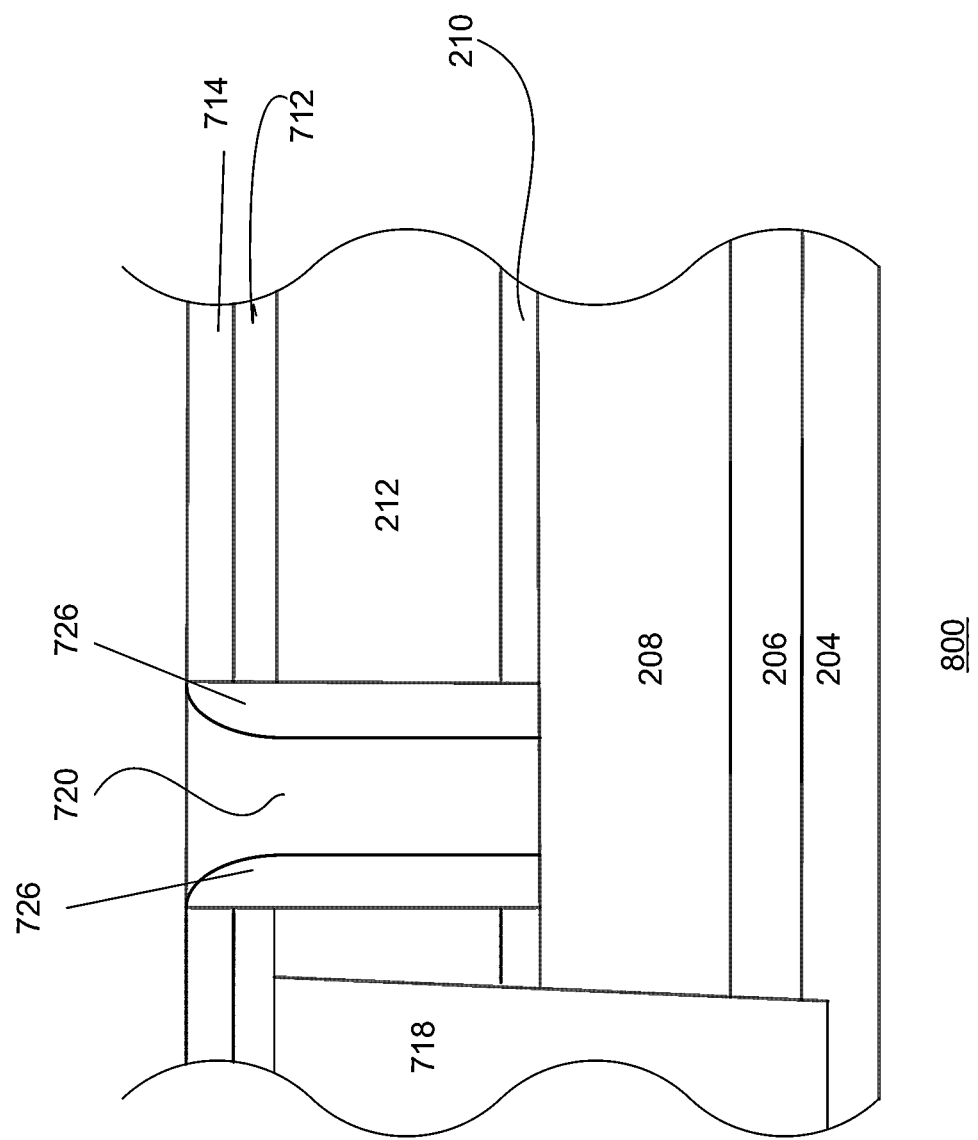
FIGS. 8a and 8b show different views of an embodiment of a thin-SOI NVM cell back-gate formation.
Figure 8B:
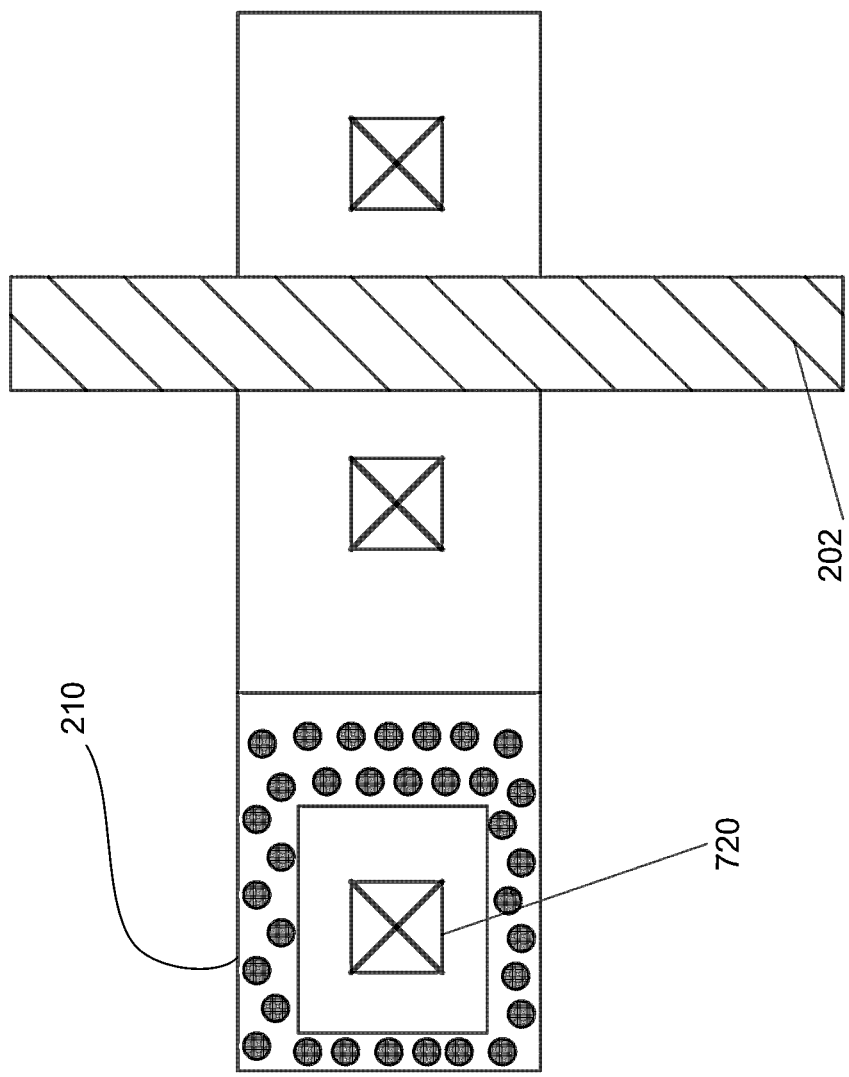

FIGS. 8a and 8b show different views of a thin-SOI NVM cell back-gate formation. FIG. 8a shows a cross-sectional view of a partially processed thin-SOI NVM memory cell 800 as described above which shows the contact 720 to the back-gate 208. As shown, on both sides of contact 720 are spacers 726. Above the back-gate 208 is a buried oxide layer 210, which is below silicon body 212. Silicon body 212 is below an oxide layer 712, which is between the silicon 212 and a nitride layer 714. Where necessary, the contact to the back-gate may also be formed by etching back the poly Si to optimize the poly back-gate contact height. The capping layer, such as the SiN/SiO$_2$ layer 712 and 714 may also be removed to expose the active Si for subsequent process steps.

FIG. 8b shows a partial top view (along the source direction) of a thin-SOI NVM cell back-gate formation for indicating how the back-gate contact 720 is formed. As shown, the back-gate may be connected through contact 720 by etching through the buried oxide 210 of the SOI wafer. The back-gate together with the first polarity band (both not shown in this view) are along the active region.

FIG. 9 shows a table of the biased conditions on the various terminals of the thin-SOI NVM cell. As can be seen, the source terminal is zero whether the cell is selected or unselected regardless of what state the cell is in. The drain terminal when selected will be Vdd when the memory cell is in the read state, but when in the program state, it will be Vdrain. The drain terminal will be zero when in the erase state or when unselected. The control gate (CG) terminal when selected will be Vprog in the program state, a negative voltage −Verase in the erase state and Vdd in the read state. The Vdd, Vdrain, Vprog and −Verase may include any suitable voltage values, depending on cell architecture.

When unselected, the CG terminal will be zero regardless of what state the cell is in. The back-gate (BG) terminal, on the other hand, will be zero in all the states when selected. When unselected, the BG terminal will be a small Vinhib1 when in the program state, i.e., the gate is inhibited from functioning during the programming state; zero in the erase state; and a negative voltage −Vdd to prevent the terminal from being sensed during the read state. By applying a small potential to the back-gate of the unselected memory cell, high leakage associated with the memory cell having over erase issue can be eliminated, thus enabling the proper reading of the selected memory cell.

The thin-SOI NVM memory cell is advantages as it is a truly single feature size NOR-type NVM cell architecture, with minimum spacing scale with current embedded advanced logic technology. Furthermore, the device architecture requires much simpler processes as compared to its split gate NVM counterpart. As such, the concerns for split gate etch and lithographic process challenges can be greatly reduced. Moreover with its back-gated thin-SOI baseline, its full depletion of channel leads to perfect sub-threshold slope, minimal RDF and low leakage floor, which lead to less read disturb and faster speed.

In addition, the memory cell design is very flexible as various Vt can be designed with different back-gate bias applied. It is also applicable for both high-K and non-high-K processes and can be incorporated into both gate-first and gate-last processes, charge trap SiN or nano-crystal or floating NVM processes depending on needs, as the proposed basic cell structure is simple and thus flexible. Finally, the proposed embodiment also has the potential advantage of removing the NVM high voltage module as with the concept of back-gate control, the applied CG voltage for Fowler-Nordheim erasure or programming bias can be reduced. Also, with less cycling voltage stress distributed across the tunneling oxide for the proposed cell, better NVM cell endurance and retention may potentially be obtained.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:
1. A non-volatile memory device comprising:
    a substrate having a non-volatile memory cell region, the substrate includes a buried oxide (BOX) layer between a surface substrate layer and a base substrate layer;
    at least one isolation region in the substrate, wherein the at least one isolation region isolates the non-volatile memory cell region from other active regions, the isolation region extends from a top surface of the surface substrate layer to a depth deeper than the BOX layer;

a first polarity type band/well disposed within the base substrate layer, wherein the first polarity type band/well includes a depth shallower than a bottom of the at least one isolation region; and a non-volatile memory (NVM) cell disposed on the substrate in the memory cell region, wherein the non-volatile memory cell comprises a transistor, the transistor includes a first gate of the memory cell disposed on a surface of the surface substrate layer, the first gate includes a charge storage layer, the first gate functions as a control gate of the memory cell, and a second gate of the memory cell disposed in the base substrate layer, wherein the second gate is configured as a select gate of the NVM cell.

2. The memory device of claim 1 wherein the first gate is coupled to a control gate terminal and the second gate is coupled to a back gate terminal, wherein the NVM cell is selected or accessed by applying a corresponding bias to the control gate terminal and the back gate terminal to perform program, erase or read operations.

3. The memory device of claim 1 wherein the charge storage layer comprises a floating gate.

4. The memory device of claim 1 wherein:
the surface substrate layer comprises silicon; and
the second gate is a back gate to the first gate and the second gate is embedded in the substrate and is disposed within the base substrate layer, wherein the second gate includes a depth shallower than the first polarity type band/well.

5. The memory device of claim 4 wherein:
the first polarity band/well isolates a second polarity doped back gate control layer from the base substrate layer, wherein the BOX layer and back gate control layer serve as the second gate to control the memory device threshold voltage.

6. The memory device of claim 1 wherein the thickness of the surface substrate layer is less than about 30 nm and the thickness of the BOX layer is less than about 5 nm.

7. The memory device of claim 1 wherein the first gate comprises a control gate electrode disposed over the charge storage layer.

8. The memory device of claim 7 wherein the charge storage layer is isolated from the control gate electrode and surface substrate layer by dielectric layers.

9. A method for forming a non-volatile memory device comprising:
providing a substrate, the substrate includes a buried oxide (BOX) layer between a surface substrate layer and a base substrate layer;
forming at least one shallow trench isolation (STI) region in the substrate, wherein the STI region extends from a top surface of the surface substrate layer and partially into a portion of the base substrate layer;
performing a first implant to form a first polarity well within the base substrate layer, wherein the first polarity well comprises a depth shallower than a bottom of the STI region;
performing a second implant to form a second polarity type back gate control layer within the base substrate layer, wherein the back gate control layer comprises a depth shallower than a bottom of the first polarity well; and forming a non-volatile memory module on the substrate, wherein forming the non-volatile memory module comprises
forming a first gate on a surface of the surface substrate layer, the first gate includes a charge storage layer and functions as a control gate of the memory module, and
forming a second gate in the base substrate layer that functions as a select gate of the memory module.

10. The method of claim 9 wherein the surface substrate layer and the base substrate layer comprise silicon.

11. The method of claim 9 wherein the charge storage layer comprises a nitride layer.

12. The method of claim 9 wherein the charge storage layer comprises a floating gate.

13. The method of claim 9 further comprising:
forming a back gate contact opening, wherein the back gate contact opening extends from the top surface of the surface substrate layer to a bottom of the BOX layer;
forming sidewall spacers on sidewalls of the back gate contact opening, wherein the sidewall spacers extend from the top surface of the surface substrate layer to the bottom of the BOX layer; and
filling the back gate contact opening with polysilicon to form a back gate contact.

14. The method of claim 9 wherein the thickness of the surface substrate layer is less than about 30 nm and the thickness of the BOX layer is less than about 5 nm.

15. The method of claim 9 wherein the BOX layer and back gate control layer serve as the second gate to control the memory device threshold voltage.

16. The method of claim 9 wherein the first gate comprises a control gate electrode disposed over the charge storage layer.

17. The method of claim 9 further comprising applying a bias to the back gate control layer to store data in the charge storage layer of the first gate of the non-volatile memory module.

18. A method for forming a device comprising:
providing a substrate, the substrate includes an insulator layer between a body substrate layer and a base substrate layer;
forming at least one isolation region in the substrate, wherein the isolation region extends from a top surface of the body substrate layer and partially into a portion of the base substrate layer;
forming a first polarity well within the base substrate layer, wherein the first polarity well comprises a depth shallower than a bottom of the at least one isolation region; and
forming a non-volatile memory module on the substrate, wherein forming the non-volatile memory module comprises
forming a select gate embedded in the substrate, wherein the select gate includes a depth shallower than the first polarity well, and
forming a control gate on a surface of the substrate, the control gate includes a charge storage layer and a gate electrode layer over the charge storage layer.

19. The memory device of claim 1 wherein:
the substrate comprises an array region having a plurality of the NVM cells arranged in rows and columns, wherein each row of NVM cells is commonly coupled to a corresponding first terminal and each column of NVM cells is commonly coupled to a corresponding second terminal; and wherein biasing a first terminal selects for the corresponding row of NVM cells and biasing a second terminal selects for the corresponding NVM cell along the selected row for access to perform program, erase or read operations.

* * * * *